US011012094B2

(12) United States Patent
Chow (10) Patent No.: US 11,012,094 B2
(45) Date of Patent: May 18, 2021

(54) ENCODER WITH MASK BASED GALOIS MULTIPLIERS

(71) Applicant: ATI Technologies ULC, Markham (CA)

(72) Inventor: Wing-Chi Chow, Toronoto (CA)

(73) Assignee: ATI Technologies ULC, Markham (CA)

( * ) Notice: Subject to any disclaimer, the term of this patent is extended or adjusted under 35 U.S.C. 154(b) by 0 days.

(21) Appl. No.: 16/218,581

(22) Filed: Dec. 13, 2018

(65) Prior Publication Data

US 2020/0195275 A1    Jun. 18, 2020

(51) Int. Cl.
*H03M 13/15* (2006.01)
*H03K 19/21* (2006.01)
*H03M 13/00* (2006.01)
*H03M 13/11* (2006.01)

(52) U.S. Cl.
CPC ........ *H03M 13/1515* (2013.01); *H03K 19/21* (2013.01); *H03M 13/1134* (2013.01); *H03M 13/158* (2013.01); *H03M 13/6516* (2013.01)

(58) Field of Classification Search
CPC ......... H03M 13/1515; H03M 13/6516; H03M 13/158; H03M 13/1134; H03K 19/21
USPC ........................................................ 714/784
See application file for complete search history.

(56) References Cited

U.S. PATENT DOCUMENTS

| 5,818,855 | A | 10/1998 | Foxcroft | |
| 6,760,742 | B1 * | 7/2004 | Hoyle | G06F 7/724 708/492 |
| 8,176,396 | B2 * | 5/2012 | Dong | H03M 13/1515 714/784 |
| 9,954,553 | B1 * | 4/2018 | Langhammer | H03M 13/1595 |

OTHER PUBLICATIONS

Clarke, C.K.P; Reed-Solomon error correction; BBC R&D White Paper, WHP 031; Jul. 2002.

* cited by examiner

*Primary Examiner* — James C Kerveros
(74) *Attorney, Agent, or Firm* — Faegre Drinker Biddle & Reath LLP (57) ABSTRACT

A programmable digital data encoder employs error correcting coding that uses Galois field multiplication logic wherein each bit of the product is produced by first applying pre-calculated mask values or mask values calculated via a processor executing code, and then applying an XOR circuit together with the mask bits from the pre-calculated or generated mask. In one example, a set of Galois field multipliers is used wherein each multiplier in the set includes a plurality of 2-bit input AND gate circuits and an m-bit input XOR gate circuit to produce a bit of the product. In one example, there are "m" mask values in a mask table wherein m is the symbol width. A different mask value is applied for each bit of the product. The mask values are each m-bits wide, and are stored, for example, in memory as a small look-up table with m m-bit entries or in m m-bit wide registers.

18 Claims, 7 Drawing Sheets

| Output bit # | GF(10) x15 mask | GF(8) x15 mask |
|---|---|---|
| 0 | 11000001 | 0011000001 |
| 1 | 11000011 | 0011000011 |
| 2 | 10000111 | 0001100111 |
| 3 | 11001111 | 0000101111 |
| 4 | 11001110 | 0010011110 |
| 5 | 10011100 | 0001111100 |
| 6 | 00111000 | 0011111000 |
| 7 | 00111000 | 0011110000 |
| 8 | 01110000 | 0000000000 |
| 9 | 11100000 | 0000000000 |

Note 1: For this example, max bit-width is 10-bits
Note 2: For GF(8), only lower 8-bits are used; unused (upper) bits are mapped to '0'

FIG. 8

ENCODER WITH MASK BASED GALOIS MULTIPLIERS

BACKGROUND OF THE DISCLOSURE

Figure 1:
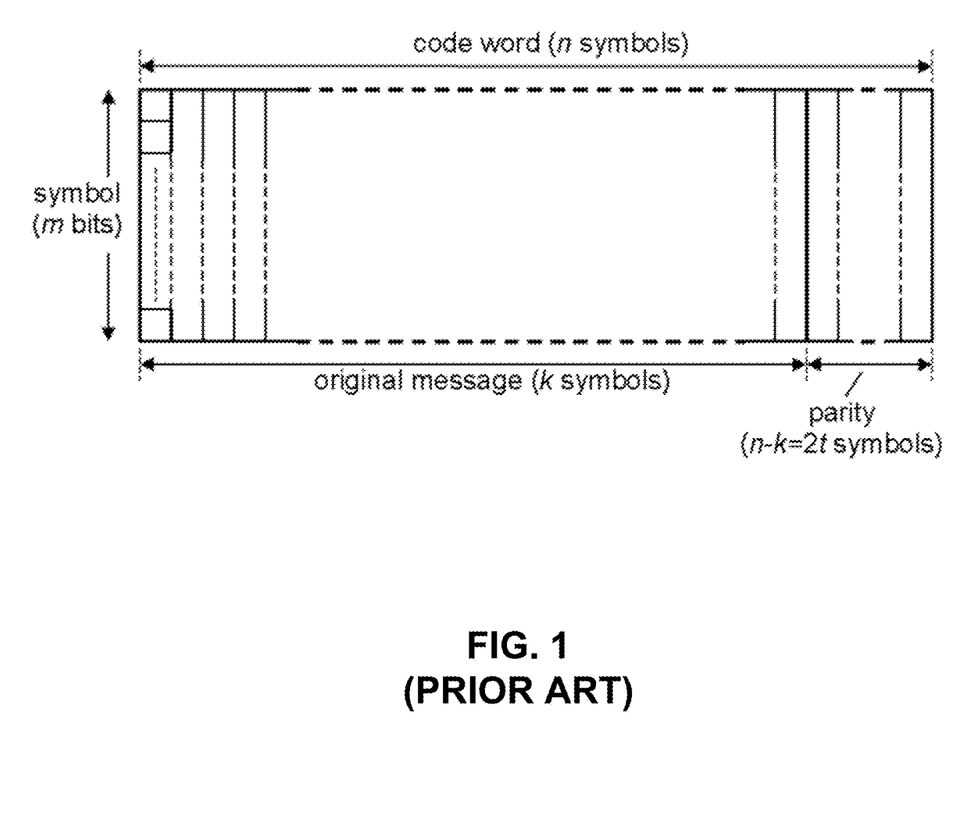
FIG. 1 is a diagram illustrating a Reed-Solomon codeword.

Encoders and decoders used to encode and decode image data, audio data and any other data, by digital techniques are known to use Reed-Solomon encoding as an error correction code to protect communicated data. Galois field (GF) multipliers are used in many computing applications such as Reed-Solomon forward error correction circuits. Reed-Solomon code is a block code wherein the message to be transmitted is divided up into separate blocks of data. Each block then has parity protection information added to it to form a self-contained code word. A Reed-Solomon code is a linear code meaning adding two code words produces another code work and it is cyclic (cyclically shifting the symbols of a code word produces another code word). Such a code belongs to the family of Bose-Chaudhuri-Hocquenghem (BHC) codes and has multi-bit symbols. As illustrated in FIG. 1, a Reed-Solomon code can be described as an (n, k) code wherein n is the block length in symbols, k is the number of information symbols in the message, and n-k is the number of parity symbols. Each code word has n symbols and each symbol is made up of m bits.

Encoders and decoders are needed that can accommodate differing code word configurations such as those used for different display standards. By way of example, a video encoder that outputs encoded data for a Display Port interface also needs to be flexible to output encoded video data for a High Definition Multimedia Interface (HDMI). Fully flexible GF multipliers are impractical. For example, circuitry for such a fully flexible GF multiplier uses large, slow, complex logic with shifters, AND gates and XOR gates. As such, one solution is to employ GF multiplier circuitry that accommodates variable width GF symbols that are multiplied by a predetermined constant GF symbol. These are sometimes referred to as "constant" GF multipliers. These solutions either use small fixed circuitry that can only be used for a particular symbol width and primitive polynomials or such solutions use programmable, but large and slow look-up tables that can accommodate different symbol widths or primitive polynomials. However, the large look-up tables require significant amounts of memory and additional interface complexity.

Figure 2:
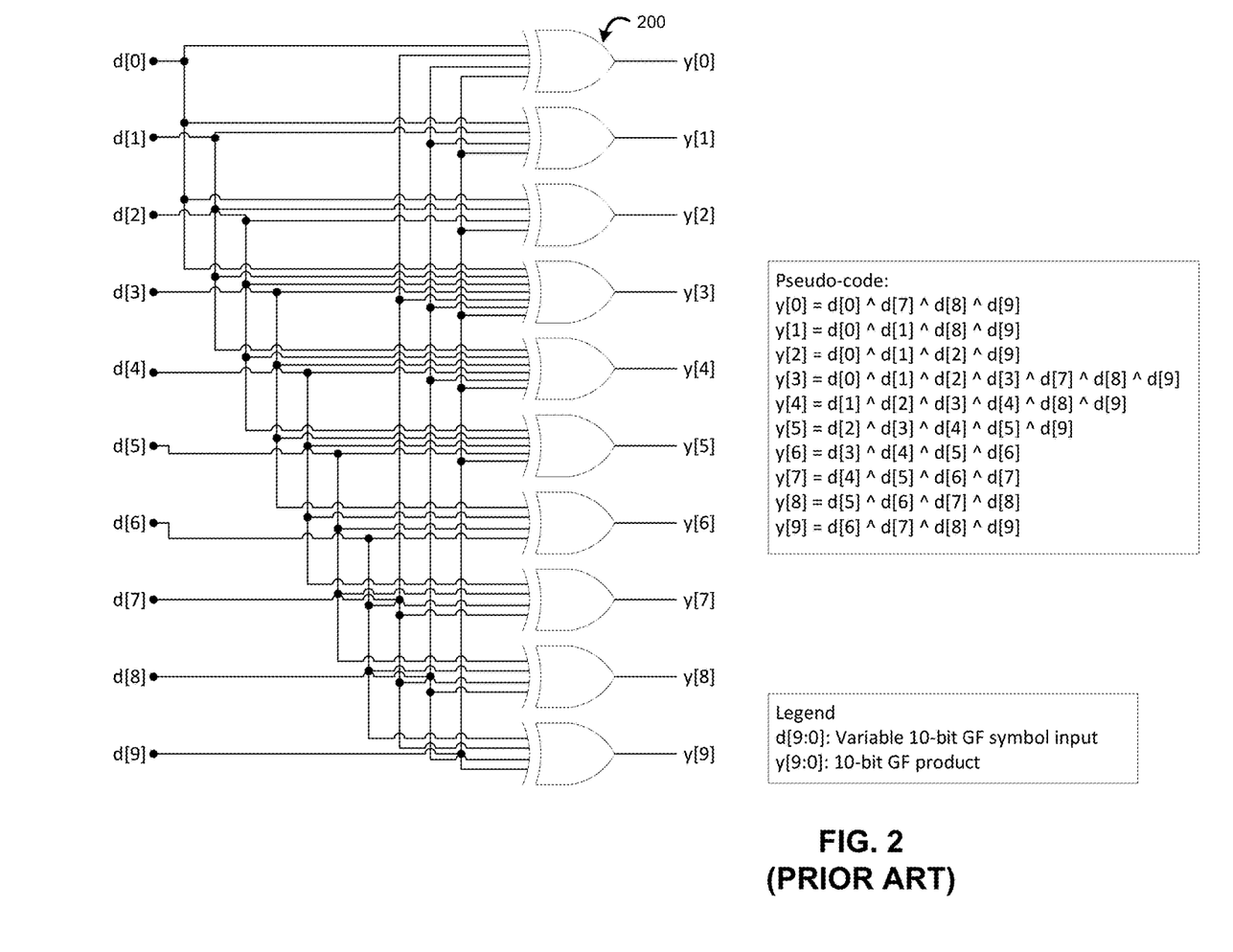
FIG. 2 is a diagram illustrating a prior art example of a GF multiplier.

FIG. 2 illustrates one example of a solution that uses small fixed circuitry with XOR gates 200. Each bit of the product requires an XOR gate with an average of m±2 input bits. However, this solution must be redesigned for different symbol widths or primitive polynomials. As such, this design of GF multipliers can be impractical for products that require differing encoding schemes.

Figure 3:
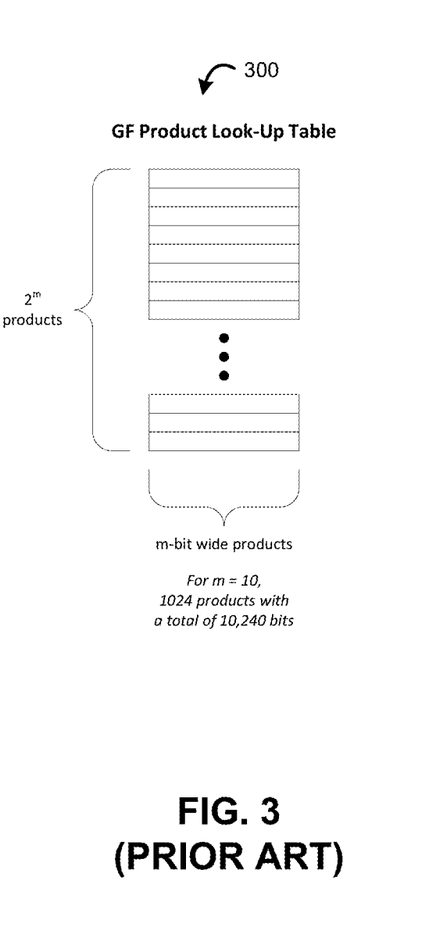
FIG. 3 is a diagram illustrating one example of a prior art GF product look-up table.

FIG. 3 illustrates another example of a GF product look-up table 300 that are populated with pre-calculated GF products and can be used for different symbol widths or primitive polynomials. However, these tables are large requiring 2 m space m-bit wide entries and are often slow. Accordingly, there exists a need for an improved data encoder that employs programmable and flexible implementation solutions.

BRIEF DESCRIPTION OF THE DRAWINGS

The implementations will be more readily understood in view of the following description when accompanied by the below figures, wherein like reference numerals represent like elements, and wherein.

DETAILED DESCRIPTION OF IMPLEMENTATIONS

A programmable digital data encoder employs error correcting coding that uses Galois field multiplication logic wherein each bit of the product is produced by first applying pre-calculated mask values or mask values calculated via a processor executing code, and then applying an XOR circuit together with the mask bits from the pre-calculated or generated mask. In one example, a set of Galois field multipliers is used wherein each multiplier in the set includes a plurality of 2-bit input AND gate circuits and an m-bit input XOR gate circuit to produce a bit of the product. In one example, there are "m" mask values in a mask table wherein m is the symbol width. A different mask value is applied for each bit of the product. The mask values are each m-bits wide, and are stored, for example, in memory as a small look-up table with m m-bit entries or in m m-bit wide registers.

In some implementations, a programmable digital data encoder that employs error correcting coding includes mode selector logic that selects a variable symbol width symbol size m and selects mask look up table data that includes m masks of m-bit wide masks. The encoder employs Galois field (GF) multiplication logic, that is responsive to the selected mask look up table and includes m sets of GF multiplication bit circuits, each GF multiplication bit circuit includes a plurality of parallel 2 bit AND gate circuits, each of the AND gate circuits having one input configured to receive a data bit and another input coupled to receive a mask bit of a corresponding mask j (i.e., mask value) from the mask look up table data, an XOR gate circuit having m bit inputs each coupled to a respective output of each of the plurality of parallel 2 bit AND gates, and operative to output forward error correction data. An output stage processes the forward error correction data and outputs resulting data as parity symbols to include as block encoded data.

As such, the programmable digital data encoder is programmable to encode using differing encoding schemes using different symbol widths and/or different primitive polynomials by using different masks. The mask look-up table data is selected to correspond to different primitive polynomials and/or symbol widths. As such, the programmable encoder can more cost effectively accommodate different encoding schemes.

Figure 4:
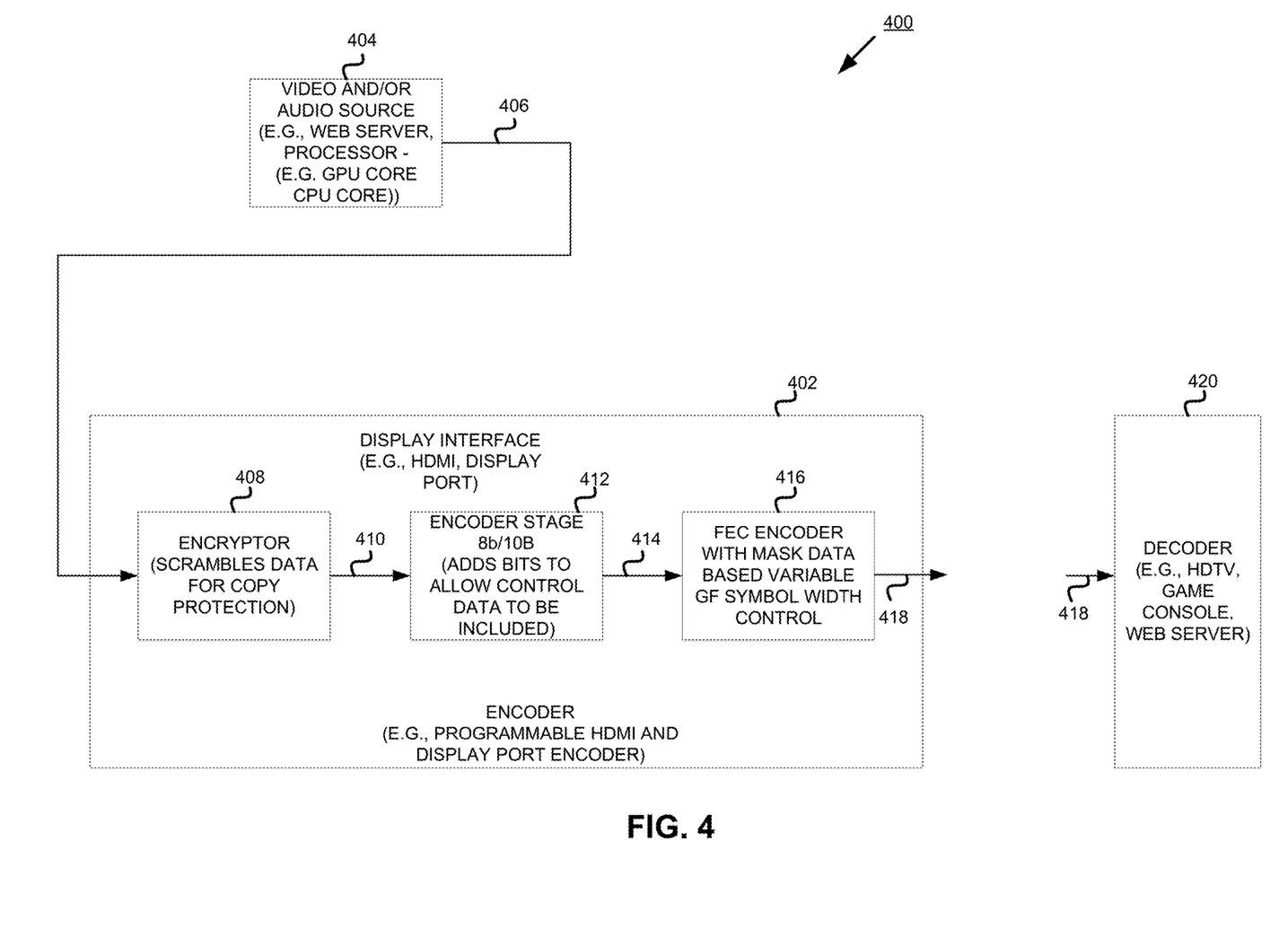
FIG. 4 is a functional block diagram of an apparatus in accordance with one implementation set forth in the disclosure.

Examples of differing implementations of a programmable digital data encoder will be described below with reference to FIGS. 4-8. FIG. 4 illustrates one example of an apparatus 400 that employs an encoder 402 to encode data such as video data and/or audio data or any suitable data. The apparatus 400 may be any suitable apparatus and may include, for example, a smart phone, printer, web server, one or more integrated circuits, laptop, tablet, wearable, desktop, set top box, digital television, or any other suitable device or devices. In this example, the encoder 402 is implemented as part of a display interface that is coupled to a data source 404 such as a video and/or audio source. For example, the data source 404 may be a graphics processing unit (GPU), central processing unit (CPU), accelerated processing unit (APU), web server, or any other suitable processor or apparatus that provides data 406 (also referred to as message data) to be encoded by the encoder 402. In one example, the encoder 402 may be implemented as an integrated circuit or portion of an integrated circuit. In this example, the encoder 402 is programmable to encode HDMI formatted data and Display Port formatted data. However, any suitable data format may be employed. The encoder 402 includes an encryptor 408, as known in the art, that scrambles data for copy protection purposes. Scrambled data 410 output by the encryptor 408 is then provided to an encoder stage 412 that, in this example, is an 8 bit/10 bit encoder that adds bits to allow control data to be included with the message data. Any other suitable encoders may also be used (e.g., 128/132 bit encoders or other suitable encoders). The encoder stage 412 outputs enhanced data 414 with the additional control bits to a forward error correction (FEC) encoder 416. The FEC encoder 416 is a mask data based variable GF symbol width based encoder as further set forth below. The FEC encoder outputs block encoded data 418 that includes codewords of n symbols that include data of k symbols wherein each of the symbols is m bits wide, along with parity symbols (see format of FIG. 1). The block encoded data 418 is communicated to another subsystem within device 400 or to another device 420 that includes a decoder, such as an HDTV, game console, web server or any other suitable device that decodes the block encoded data 418 encoded by the encoder 402.

The encoder 416 may be implemented as hardware such as one or more state machines with associated registers, field programmable gate arrays (FPGAs), GPU, one or more processors that execute executable instructions that when executed, cause the processor to operate as described herein or any suitable combination of hardware and/or processors executing code. The encoder 402 may be a stand-alone encoder or may be integrated as part of a system or subsystem on a chip, or in any other suitable manner.

Figure 5:
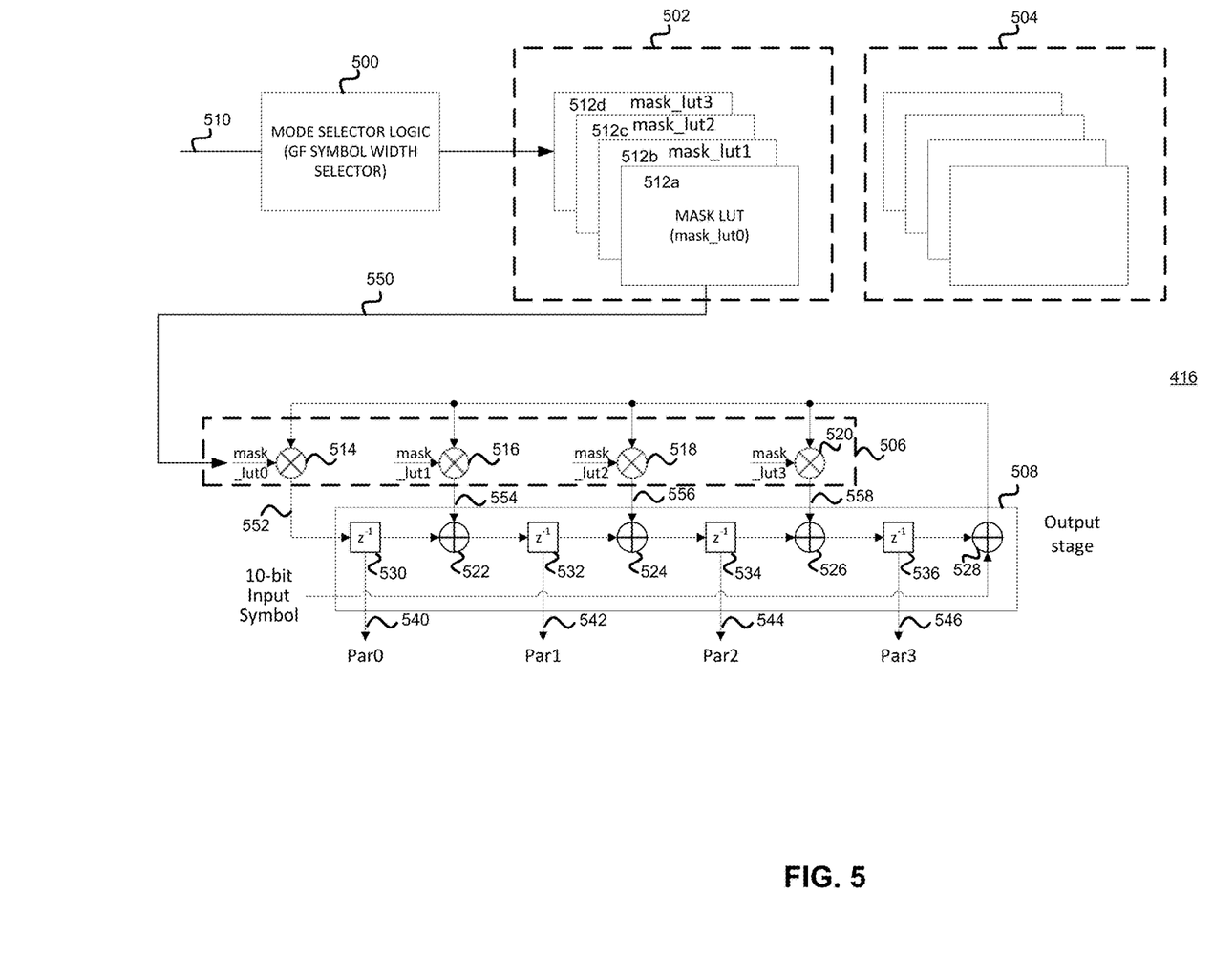
FIG. 5 is a block diagram illustrating one example of GF multiplication logic in accordance with one example set forth in the disclosure.

FIG. 5 is a diagram illustrating one example of the FEC encoder 416. In this example, the FEC encoder 416 includes mode selector logic 500, mask lookup table data 502 and 504, Galois field multiplication logic 506 and an output stage 508. The mode selector logic 500 selects via a register which mode the FEC encoder 416 is to operate in. For example, a mode selection signal 510 is produced by the video source such as a processor running an operating system, or an application running on the device such as a video playback application, or any other suitable source that indicates which encoder mode that the programmable digital data encoder 416 should be set to, to suitably encode data. The selected mode selects mask lookup table data that requests a selected GF symbol width and/or primitive polynomials scheme used to encode the data. For example, one mode may be an HDMI 2.1 protocol mode whereas another mode may be a Display Port 1.4 protocol mode. However, it will be recognized that any suitable mode may be selected depending upon the type of desired encoder. For example, the mode that is selected can represent a different symbol width and/or different mask data wherein the mask data is based on the needed primitive polynomials employed as a GF multiplier.

In one example, the mode selector logic 500 selects a variable symbol width symbol size m for a forward error correction encoder 416. For example, a 10 bit symbol wide mode may be selected or an 8 bit symbol wide mode may be selected or any other suitable symbol width size. Corresponding mask lookup table data 502 or 504 is selected that corresponds to the desired mode. For example, mask LUT data 502 may correspond to HDMI 2.1 encoding protocol and mask LUT 504 may correspond to Display Port 1.4 encoding protocol. In this example, the mask lookup table data 502 or 504 includes four lookup tables 512a-512d because there are four GF multiplication circuits 514, 516, 518 and 520 shown in the Galois field multiplication logic 506. In this example, the mask lookup table data 502 and in particular, each of the mask lookup tables 512a-512d are stored in memory such as ROM or in registers selectable by the mode selector logic 500 and in this example, the mask lookup tables are precalculated and may be stored during manufacturing of the apparatus. Alternatively, the mask lookup tables 512a-512d may be downloaded from a suitable source during application of the apparatus as desired. In another example, the mode selector logic includes a processor that executes mask generation code that causes the mask lookup tables to be generated once the mode selector logic 510 has determined which mode is desired. Each of the mask_lut0, mask_lut1, . . . each have 10 masks, one mask for each output bit of the GF multiplication circuits 514, 516, 518 and 520. For example, mask_lut0 consists of $mask0_0$, $mask0_1$, $mask0_2$, . . . $mask0_9$.

Figure 6:
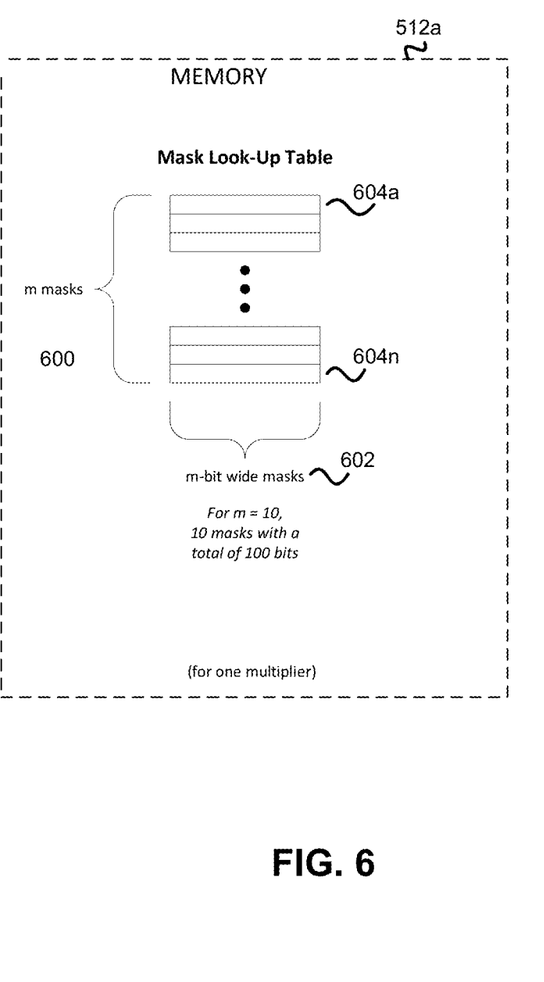
FIG. 6 is a diagram illustrating an example of mask look-up table data for use with a GF multiplier in accordance with one example set forth in the disclosure.

FIG. 6 illustrates one example of the mask lookup table 512a which includes m masks 600 of m bit wide masks 602. For example, where the symbol width is 10, there are 10 masks 604a-604n, each that are 10 bits wide, resulting in a total of 100 mask bits. As further shown below, each mask 604a-604n serves to mask data to select which data is used to produce a product bit of the GP multiplier. One mask lookup table 512a is employed for each multiplier 514-520. Referring back to FIG. 5, another set of mask lookup table data 504 is shown that may be, for example, for a symbol width of 8 symbols or may be another 10 bit symbol but with differing mask bits corresponding to different primitive polynomials that are to be used. FIG. 5 only shows four multiplier circuits 514-520, corresponding to four parity symbols per block, for clarity purposes, but if there are a different number of parity symbols per block, then there will as many multiplier circuits as parity symbols.

The output stage 508 includes a plurality of parallel GF adder circuits 522, 524, 526, 528 and corresponding delay stages 530, 532, 534 and 536. The parallel GF adder circuits 522-528 and the corresponding delay stages 530-536 are configured to produce parity symbols 540, 542, 544 and 546.

In operation, mask data 550 from the mask lookup table data 502 and in particular, from each of the mask lookup tables 512a-512d are provided to each corresponding GF multiplication circuit 514-520. As such, the GF multiplication logic 506 is responsive to the selected mask lookup table data 502. Each of the GF multiplication circuits 514-520 produces forward error correction data 552, 554, 556 and 558 respectively. The delay stages 530 in this example, are implemented using a 10 bit register for a symbol width size of 10. However, any suitable delay stage may be employed. The GF adders 522-528 operate as conventional GF adders. As represented in FIG. 5, the mask_lut 0 512*a*, mask_lut 1 512*b* . . . each have a mask entry for each output bit of the GF multiplier. For example, mask_lut 0 includes 10 bit mask $0_0$, 10 bit mask bit $0_1$ . . . 10 bit mask bit $0_9$ for a 10 bit symbol width.

Figure 7:
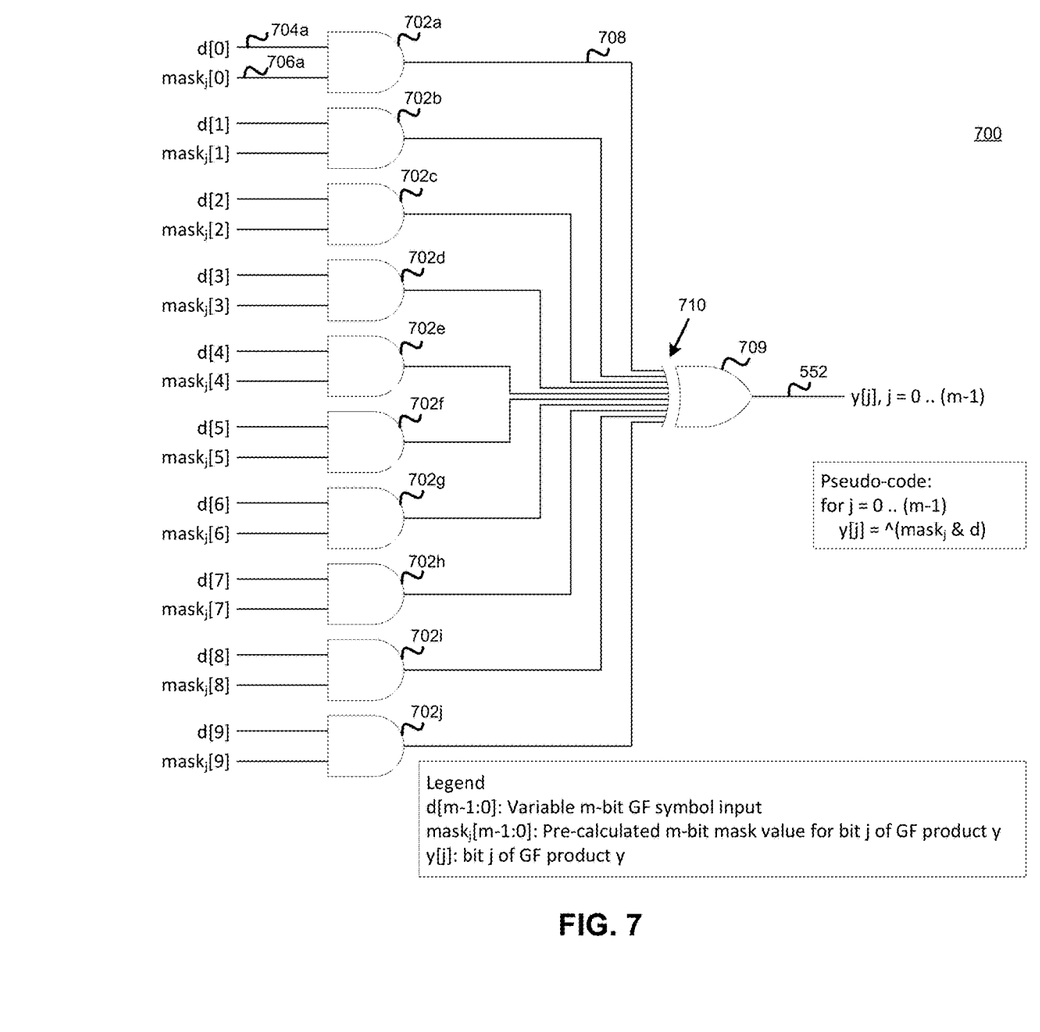
FIG. 7 is a circuit diagram illustrating one example of a GF multiplier bit.

Referring to FIG. 7, one example of a GF multiplication bit circuit for GF multiplication circuit 514 is shown. It will be recognized that this is one instantiation and that 10 such bit circuits would be employed as a set for multiplier 514 if m, the symbol size, is 10. As such, a set of ten multiplication bit circuits 700 make up multiplication circuit 514. As shown in FIG. 5, multiplication circuits 514-520 are sets of GF multiplication circuits that correspond to the number of parity symbols and that each multiplication circuit 514 includes m instantiations per GF multiplication bit circuit shown in FIG. 7. The GF multiplication bit circuit 700 includes a plurality of parallel 2 bit AND gates 702*a*-702*j*. Each of the AND gate circuits 702*a*-702*j*, in this example 10 which corresponds to the symbol size width of m=10, has one input configured to receive a data bit shown as 704*a* and another input coupled to receive a mask bit 706*a* from mask $0_0$ (e.g., 604*a*) in this example (see FIG. 5). The mask bit corresponds to bit 0 in mask j from the mask lookup table data 512*a* in this example.

Stated another way, mask lookup table data 604*a* is input as mask j [0] . . . mask j [9]. Each of the respective parallel 2 bit AND gates has a corresponding output 708 that is input to an XOR gate circuit 709 having m bit inputs 710 each coupled to a respective output of each of the plurality of parallel 2 bit AND gates. The XOR gate circuit 709 outputs 1 bit of forward error correction data 552 which, in this example, is a 10 bit GF multiplication product. As previously noted, in the example where the symbol width is 10, there is a set of ten GF multiplication bit circuits 700 for each GF multiplication circuit. The output stage 508 processes the forward error correction data 552-558 and outputs resulting data as parity symbols 540-546 for a codeword configured as block encoded data. As such, the FEC encoder 416 also generates the block encoded data 418 that includes a codeword of n symbols including data of k symbols, each m bits wide and the parity symbols 540-546 to form a codeword format. This is shown as 418.

Figure 8:
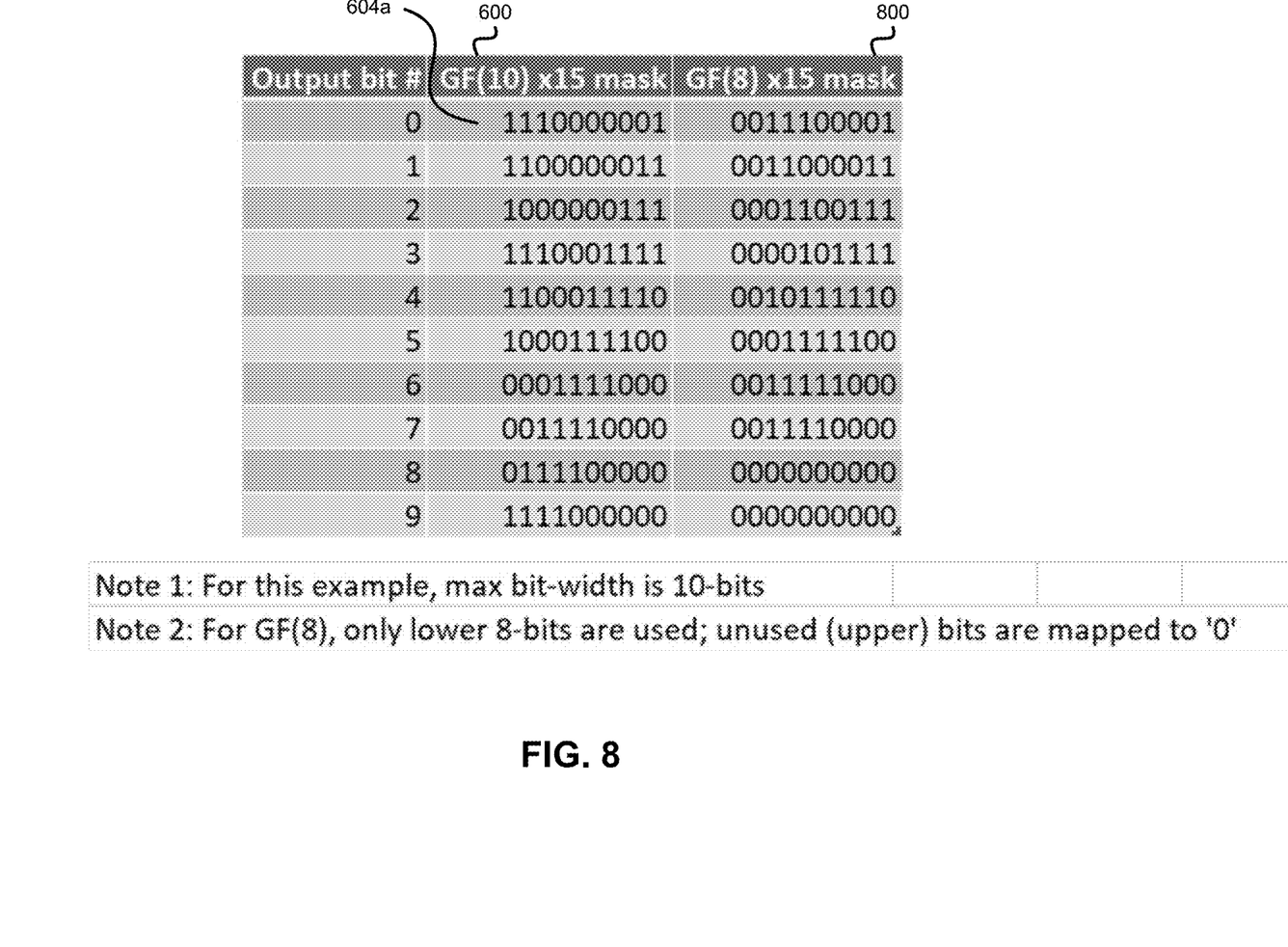
FIG. 8 is an example mask look-up table in accordance with one example set forth in the disclosure.

FIG. 8 illustrates one example of a mask lookup table 512*a* for a 10 bit wide symbol width where the GF multiplication factor is multiplication by 15. The mask values 604*a* have 10 bits that are used to mask the data that is actually passed to the XOR gate shown in FIG. 7. For example, mask lookup table data 600 is for a symbol width of 10, whereas mask lookup table data 800 is for an 8 bit symbol width but only the lower 8 bits and the first 8 mask entries are used.

The column showing GF (10)×15 mask "may be useful, for example, with a 10 bit symbol width for Display Port 1.4 whereas the GF (8)×15 mask" 800 could be employed with HDMI 2.1 protocols. It will be recognized that these are simply examples and that any suitable mask bits may be employed as desired. Different coefficients for primitive polynomials are used to precompute the masks and the masks vary based on symbol width and primitive polynomials that are used for the GF multiplication.

In an implementation where the mode selector logic 500 is implemented as a processor executing mode selection code, the processor, also referred to as processing logic, generates the mask lookup table data 502 instead of having the mask lookup table data being precomputed and being stored in memory or registers. The processing logic generates the mask lookup table data 600 that corresponds to the Galois field multiplication primitive polynomials that are desired for the given mode in response to the selected symbol width size information 510. For example, the processing logic generates the mask data shown in FIG. 8 by employing the polynomial information noted above with respect to FIG. 8.

FIG. 8 is an example of two selectable GF mask LUTs for a set of multipliers 700 shown in FIG. 7. Where one GF mask LUT 600 is for a bit width of 10 and another GF mask 800 is for a bit width of 8 bits. The GF primitive polynomials for these example GF mask LUTs are GF(10): $p(x)=x^{10}+x^3+1$ and GF(8): $p(x)=x^8+x^4+x^3+x^2+1$ respectively. However, it will be recognized that the bit width can be the same for multiple LUTs for example where the GF masks are different due to different primitive polynomials.

Among other technical solutions, the disclosed encoder employs mask data based GF multiplication operations, employ mask table data to overcome the limitations of prior systems and add programmability to the fixed circuit solution at a modest cost. For example, smaller mask lookup tables are employed compared to product lookup tables used in previous solutions. Other technical benefits will be recognized by those of ordinary skill in the art.

The above detailed description and the examples described therein have been presented for the purposes of illustration and description only and not for limitation. For example, the operations described are done in any suitable manner. It is therefore contemplated that the present implementations cover any and all modifications, variations or equivalents that fall within the scope of the basic underlying principles disclosed above and claimed herein. Furthermore, while the above description describes hardware in the form of a processor executing code, hardware in the form of a state machine or dedicated logic capable of producing the same effect, other structures are also contemplated.

What is claimed is:

1. A programmable digital data encoder that employs error correcting coding, the encoder comprising:
mode selector logic operative to select a variable symbol width symbol size m for a forward error correction encoder and operative to select mask look up table data that includes m masks of m-bit wide masks;
Galois field (GF) multiplication logic, operatively responsive to the selected mask look up table, comprising sets of GF multiplication circuits corresponding to a number of parity symbols per block of encoded data, each GF multiplication circuit comprised of m sets of GF multiplication bit circuits comprised of:
a plurality of parallel 2 bit AND gate circuits, each of the AND gate circuits having one input configured to receive a data bit and another input coupled to receive a mask bit of a corresponding mask j from the mask look up table data;
an XOR gate circuit having m bit inputs each coupled to a respective output of each of the plurality of parallel 2 bit AND gates, and operative to output forward error correction data; and
an output stage operative to process the forward error correction data and output resulting data as parity symbols to be encoded as block encoded data.

2. The encoder of claim 1 comprising memory, operatively coupled to the mode selector logic, that includes multiple sets of look up tables (LUT) as the mask look up data wherein each of the sets of LUTs corresponds to a different multiplier symbol bit width and each LUT corresponds to a set of primitive polynomials associated with the selected symbol width.

3. The encoder of claim 1 comprising an output stage that is operatively coupled to the sets of GF multiplication circuits and includes a plurality of parallel GF adder circuits and corresponding delay stages operatively configured to produce the parity symbols.

4. The encoder of claim 1 comprising logic operative to generate the block encoded data comprising a code word of n symbols comprising data of k symbols each m bits wide and the parity symbols.

5. A programmable digital data encoder that employs error correcting coding, the encoder comprising:
   mode selector logic operative to select a variable symbol width symbol size m for a forward error correction encoder and operative to select mask look up table data that includes a mask of m-bit wide entries generated by processing logic,
   the processing logic operative to generate mask look up table data corresponding to Galois field multiplication primitive polynomials in response to the selected symbol width size;
   Galois field (GF) multiplication logic, operatively responsive to the selected mask look up table, comprising sets of GF multiplication circuits corresponding to a number of parity symbols per block of encoded data, each GF multiplication circuit comprised of m sets of GF multiplication bit circuits comprised of:
      a plurality of parallel 2 bit AND gate circuits, each of the AND gate circuits having one input configured to receive a data bit and another input coupled to receive a mask bit of a corresponding mask j from the mask look up table data;
      an XOR gate circuit having m bit inputs each coupled to a respective output of each of the plurality of parallel 2 bit AND gates, and operative to output forward error correction data; and
      an output stage operative to process the forward error correction data and output resulting data as parity symbols be encoded as block encoded data.

6. The encoder of claim 5 wherein the processing logic is operative to execute instructions that when executed produce multiple sets of look up tables (LUT) as the mask look up data wherein each of the sets of LUTs corresponds to a different multiplier symbol bit width and each LUT corresponds to a set of primitive polynomials associated with the selected symbol width.

7. The encoder of claim 5 comprising an output stage that is operatively coupled to the sets of GF multiplication circuits and includes a plurality of parallel GF adder circuits and corresponding delay stages operatively configured to produce the parity symbols.

8. The encoder of claim 5 comprising logic operative to generate the block encoded data comprising a code word of n symbols comprising data of k symbols each m bits wide and the parity symbols.

9. An apparatus comprising:
   an encryptor operative to encrypt source data; and
   an encoder comprising:
      mode selector logic operative to select a variable symbol width symbol size m for a forward error correction encoder and operative to select mask look up table data that includes m masks of m-bit wide masks;
      Galois field (GF) multiplication logic, operatively responsive to the selected mask look up table, comprising sets of GF multiplication circuits corresponding to a number of parity symbols per block of encoded data, each GF multiplication circuit comprised of m sets of GF multiplication bit circuits comprised of:
         a plurality of parallel 2 bit AND gate circuits, each of the AND gate circuits having one input configured to receive a data bit and another input coupled to receive a mask bit of a corresponding mask j from the mask look up table data;
         an XOR gate circuit having m bit inputs each coupled to a respective output of each of the plurality of parallel 2 bit AND gates, and operative to output forward error correction data; and
         an output stage operative to process the forward error correction data and output resulting data as parity symbols to be encoded as block encoded data.

10. The apparatus of claim 9 comprising a video data source operative to provide the source data.

11. The apparatus of claim 9 wherein the encoder comprises memory, operatively coupled to the mode selector logic, that includes multiple sets of look up tables (LUT) as the mask look up data wherein each of the sets of LUTs corresponds to a different multiplier symbol bit width and each LUT corresponds to a set of primitive polynomials associated with the selected symbol width.

12. The apparatus of claim 9 wherein the encoder comprises an output stage that is operatively coupled to the sets of GF multiplication circuits and includes a plurality of parallel GF adder circuits and corresponding delay stages operatively configured to produce the parity symbols.

13. The apparatus of claim 9 wherein the encoder comprises logic operative to generate the block encoded data comprising a code word of n symbols comprising data of k symbols each m bits wide and the parity symbols.

14. An apparatus comprising:
   an encoder comprising:
      mode selector logic operative to select a variable symbol width symbol size m for a forward error correction encoder and operative to select mask look up table data that includes m masks of m-bit wide masks;
      Galois field (GF) multiplication logic, operatively responsive to the selected mask look up table, comprising sets of GF multiplication circuits corresponding to a number of parity symbols per block of encoded data, each GF multiplication circuit comprised of m sets of GF multiplication bit circuits comprised of:
         a plurality of parallel 2 bit AND gate circuits, each of the AND gate circuits having one input configured to receive a data bit and another input coupled to receive a mask bit of a corresponding mask j from the mask look up table data;
         an XOR gate circuit having m bit inputs each coupled to a respective output of each of the plurality of parallel 2 bit AND gates, and operative to output forward error correction data;
         an output stage operative to process the forward error correction data and output resulting data as parity symbols to be encoded as block encoded data; and
      a decoder, in operative communication with the encoder, operative to decode the block encoded data.

15. The apparatus of claim 14 comprising a video data source operative to provide the source data.

16. The apparatus of claim 14 wherein the encoder comprises memory, operatively coupled to the mode selector logic, that includes multiple sets of look up tables (LUT) as the mask look up data wherein each of the sets of LUTs corresponds to a different multiplier symbol bit width and each LUT corresponds to a set of primitive polynomials associated with the selected symbol width.

17. The apparatus of claim 14 wherein the encoder comprises an output stage that is operatively coupled to the sets of GF multiplication circuits and includes a plurality of parallel GF adder circuits and corresponding delay stages operatively configured to produce the parity symbols.

18. The apparatus of claim 14 wherein the encoder comprises logic operative to generate the block encoded data comprising a code word of n symbols comprising data of k symbols each m bits wide and the parity symbols.

* * * * *